US012765333B2

(12) United States Patent
Csato et al.

(10) Patent No.: US 12,765,333 B2
(45) Date of Patent: Oct. 13, 2026

(54) METHOD FOR PRODUCING A PRETREATED COMPOSITE SUBSTRATE, AND PRETREATED COMPOSITE SUBSTRATE

(71) Applicant: MI2-FACTORY GMBH, Jena (DE)

(72) Inventors: Constantin Csato, Stammbach (DE); Florian Krippendorf, Jena (DE)

(73) Assignee: MI2-FACTORY GMBH, Jena (DE)

( * ) Notice: Subject to any disclaimer, the term of this patent is extended or adjusted under 35 U.S.C. 154(b) by 440 days.

(21) Appl. No.: 18/267,564

(22) PCT Filed: Dec. 10, 2021

(86) PCT No.: PCT/EP2021/085294
§ 371 (c)(1),
(2) Date: Jun. 15, 2023

(87) PCT Pub. No.: WO2022/128817
PCT Pub. Date: Jun. 23, 2022

(65) Prior Publication Data
US 2024/0055251 A1 Feb. 15, 2024

(30) Foreign Application Priority Data
Dec. 18, 2020 (DE) ..................... 10 2020 134 222.5

(51) Int. Cl.
*H10P 90/00* (2026.01)
*H10D 62/822* (2025.01)
(Continued)

(52) U.S. Cl.
CPC ............ *H10P 90/00* (2026.01); *H10P 10/128* (2026.01); *H10P 30/2042* (2026.01);
(Continued)

(58) Field of Classification Search
CPC ............. H01L 21/02002; H01L 21/046; H01L 21/187; H10D 62/822; H10D 62/8325;
(Continued)

(56) References Cited

U.S. PATENT DOCUMENTS 9,704,750 B2 7/2017 Rupp
2009/0156016 A1 * 6/2009 Di Cioccio ......... H10P 90/1914 438/692
(Continued)

FOREIGN PATENT DOCUMENTS

DE 102014103518 A1 9/2014
DE 102015112649 A1 2/2017
(Continued)

OTHER PUBLICATIONS

International Search Report Dated Jun. 1, 2022, 3 PAGES.
(Continued)

*Primary Examiner* — Jeff W Natalini
*Assistant Examiner* — Ian Isaac Degrasse
(74) *Attorney, Agent, or Firm* — LUCAS & MERCANTI, LLP

(57) ABSTRACT

A method for producing a pretreated composite substrate, which is used as the basis for further processing into electronic semiconductor components, includes doping a first layer of SiC in a donor substrate by ion implantation using an energy filter; generating a predetermined breaking point in the donor substrate; and producing a bonded connection between donor substrate and acceptor substrate, the first layer being arranged in a region between the acceptor substrate and a remaining part of the donor substrate. Lastly, the donor substrate is split in the region of the predetermined breaking point to generate the pretreated composite substrate. The pretreated composite substrate has the acceptor substrate and a doped layer, which is connected to the
(Continued)

acceptor substrate and includes at least a portion of the first layer of the donor substrate.

40 Claims, 17 Drawing Sheets

(51) Int. Cl.
*H10P 10/00* (2026.01)
*H10P 30/20* (2026.01)
*H10D 62/832* (2025.01)

(52) U.S. Cl.
CPC ........... *H10P 30/21* (2026.01); *H10D 62/822* (2025.01); *H10D 62/8325* (2025.01)

(58) Field of Classification Search
CPC ...... H10P 90/00; H10P 30/2042; H10P 30/21; H10P 10/128
See application file for complete search history.

(56) References Cited

U.S. PATENT DOCUMENTS

| | | | | |
|---|---|---|---|---|
| 2009/0290610 | A1 | 11/2009 | Eichler | |
| 2014/0017825 | A1* | 1/2014 | Ninomiya | H01J 37/3023 438/17 |
| 2014/0264374 | A1* | 9/2014 | Hecht | H01L 21/02529 257/77 |
| 2017/0213735 | A1 | 7/2017 | Imaoka | |
| 2019/0122850 | A1* | 4/2019 | Krippendorf | H01J 37/05 |
| 2019/0244853 | A1 | 8/2019 | Berger | |
| 2019/0311895 | A1* | 10/2019 | Montmeat | H10P 14/683 |
| 2020/0029417 | A1* | 1/2020 | Fujita | H05H 7/12 |
| 2021/0359087 | A1 | 11/2021 | Schulze | |
| 2022/0246431 | A1 | 8/2022 | Csato | |

FOREIGN PATENT DOCUMENTS

| | | | |
|---|---|---|---|
| DE | 102017127169 | A1 | 5/2019 |
| DE | 102018102415 | A1 | 8/2019 |
| DE | 102019112985 | A1 | 11/2020 |
| JP | 2009507364 | A | 2/2009 |
| WO | 2016006663 | A1 | 4/2017 |

OTHER PUBLICATIONS

Exerpt of German Office Action in De 10 2020 134 222.5, 1 PAGE.
Krippendorf et al: "Dotierung von SiC mittels Energiefilter fuer Ionenimplantation", 6 . Oktober 2015 (Oct. 6, 2015), Mikrosystemtechnik 2015; 4 (Conference Info : Mikrosystemtechnik 2015—Mikrosystemtechnik Kongress 2015; 2015; Karlsruhe , Deutschland), pp. 334-337, XP009194563.
Weisse, J. [et al.]: Impact of Al-Ion Implantation on the Formation of Deep Defects in n-Type 4H-SiC. In: 2018 22nd International Conference on Ion Implantation Technology (IIT), 2018, pp. 66-69.

* cited by examiner

METHOD FOR PRODUCING A PRETREATED COMPOSITE SUBSTRATE, AND PRETREATED COMPOSITE SUBSTRATE

BACKGROUND OF THE INVENTION

The invention relates to a method for producing a pretreated composite substrate and to a pretreated composite substrate that serves as a basis for further processing into electronic semiconductor components.

Discrete highly blocking power semiconductor components with a nominal blocking voltage of more than 600 V are generally constructed vertically both in silicon and in SiC. What this means for diodes, e.g. MPS (merged pin Schottky) diodes, Schottky diodes or p-n diodes, is that the cathode is arranged on the front side of the substrate and the anode on the reverse side of the substrate. A similar arrangement is applicable in the case of vertical power MOS (metal oxide semiconductor) components. Gate electrodes and source electrodes are on the front side of the substrate, the drain electrode on the reverse side of the substrate. The actual transistor element or the channel region in conventional power MOSFETs may be arranged parallel to the surface (D-MOS) or perpendicularly to the surface (trench MOS). Specific constructions have become established for SiC MOSFETs, e.g. trench transistors.

The width of the drift zone (=active zone, voltage-absorbing layer) is adjusted depending on the reverse blocking voltage required. For example, the width of the drift zone for a 600 V MOSFET component in silicon will be about 50 μm.

In the case of what are called superjunction components, the width of the voltage-absorbing layer may be somewhat reduced compared to "simple" vertical MOSFETs. The particular feature of this type of vertical components is that the drift zone is characterized by an alternating arrangement of vertical p- and n-doped columns. The additionally introduced p doping in the case of blocking compensates for the elevated charge in the n-doped region, which, in the on state, determines the resistance between the source electrode and drain electrode. Thus, with the same blocking capacity, the on-resistance may be reduced by up to a factor of 10 compared to conventional vertical MOS transistors. The actual transistor element, or the channel region in superjunction MOSFET architectures, may be arranged parallel to the surface (D-MOS) or perpendicularly to the surface (trench MOS).

The specific material properties of SiC, for vertical power semiconductor components, require the provision of specific production methods and the use of specific architectures of the channel and transistor regions.

Usually, the active zones of many vertical power diodes or all power transistors (MOSFETs) are formed in monocrystalline epitaxial layers. These epitaxial layers are formed or deposited on crystalline carrier wafers. This means that the doping and vertical extent (thickness) of the active epitaxial zone can be matched to the respective blocking voltage, and the highly doped carrier wafer can be optimized in terms of its doping so as to minimize its contribution to the on resistance.

Especially in the case of SiC substrates, the above-described production of the layer structure is complex and costly, since the epitaxial layer deposition and also the provision of mono-crystalline carrier wafers is enormously costly.

DE 10 2019 112 985 A1 proposes, as an alternative, producing the semiconductor component without epitaxial deposition by splitting a substrate from an SiC wafer, followed by ion implantation in the drift zone using an energy filter.

SUMMARY OF THE INVENTION

It is an object of the present invention to specify a method of producing a pretreated composite substrate, and a pretreated composite substrate on the basis of which it is possible to produce high-performance semiconductor components of high quality industrially with reduced complexity and lower costs.

According to an aspect of the invention, the method for producing a pretreated composite substrate which serves as a basis for further processing into electronic semiconductor components, wherein the pretreated composite substrate comprises an acceptor substrate and a doped layer bonded thereto, comprises the steps of:

a) providing a donor substrate including monocrystalline SiC;
b) doping a first layer in the donor substrate by ion implantation using an energy filter, wherein the energy filter is a microstructured membrane having a predefined structure profile for adapting a dopant depth profile and/or defect depth profile caused by the implantation in the first layer in the donor substrate, wherein the doping creates a predetermined dopant depth profile and/or a predetermined defect depth profile in the first layer of the donor substrate, wherein the first layer extends from the first surface of the donor substrate which faces the ion beam up to a predetermined dopant depth, followed by a remaining portion of the donor substrate;
c) creating an intended breakage site in the donor substrate;
d) providing the acceptor substrate and producing a bond between donor substrate and acceptor substrate, wherein the first layer is arranged in a region between the acceptor substrate and the remaining portion of the donor substrate;
e) splitting the donor substrate in the region of the intended breakage site to create the pretreated composite substrate, wherein the pretreated composite substrate comprises the acceptor substrate and a doped layer bonded thereto, wherein the doped layer comprises at least a section of the first layer of the donor substrate.

The first layer always consists of monocrystalline SiC. The donor substrate preferably consists entirely of monocrystalline SiC.

The first layer preferably has a thickness of 3 to 15 μm. Ion implantation can viably be conducted over a thickness of this order of magnitude.

In a preferred embodiment, the donor substrate is a crystal composed of high-quality semi-insulating SiC material (HQSSiC) of high purity. In particular, this is understood to mean a material in which the concentration of elemental impurities, especially N, B, P, is predominantly less than 5E15 $cm^{-3}$. What is meant by "predominantly" in this connection is that the criterion is applicable virtually throughout the depth profile, but there may be deviations in particular regions, for example at the surface.

In a preferred embodiment, the donor substrate is composed of SiC of the 4H, 6H or 3C polytype. These polytypes have been found to be advantageous for the production of semiconductor components.

The surface of the donor substrate facing the ion beam preferably has a deviation of less than 6°, more preferably 4°, more preferably less than 3°, even more preferably 0°, from a perpendicular to the c direction. The 4° orientation is currently being used for most component architectures. The particular benefit in the case of 0° is that the donor wafer can be cut parallel to the surface and hence more individual wafers can be obtained from one cylinder.

The donor substrate preferably has a thickness of more than 100 μm, preferably more than 200 μm, more preferably more than 300 μm, up to 15 cm, preferably up to 10 cm.

Alternatively, the donor substrate may have a carrier wafer, preferably composed of SiC, and an epitaxial layer, wherein the epitaxial layer is undoped or has doping of less than 1E15 $cm^{-3}$, preferably less than 1E14 $cm^{-3}$, and wherein the first layer is part of the epitaxial layer.

In this case, it is preferable that the epitaxial layer has a thickness of more than 10 μm, preferably more than 50 μm, more preferably more than 80 μm. The maximum thickness of such layers is generally 120 μm.

Here too, it is preferable when the surface of the epitaxial layer facing the ion beam has a deviation of less than 6°, more preferably 4°, more preferably less than 3°, even more preferably 0°, from a perpendicular to the c direction.

The epitaxial layer here is preferably composed of SiC of the 4H, 6H or 3C polytype.

It is generally preferable that the doping of the first layer affords p or n doping with a doping concentration or defect concentration in the first layer of 1E15 $cm^{-3}$ to 5E17 $cm^{-3}$. This doping concentration or defect concentration is of very good suitability for the drift zone (active layer, power-absorbing layer) of a multitude of high-performance components. The doping may be constant across the thickness of the first layer or may show a different doping profile.

The first layer is preferably doped with ions of one of the following elements: N, P, B or Al.

The primary energy range of the ion beam in the doping of the first layer is preferably between 1 MeV and 50 MeV.

In a preferred embodiment, the doping of the first layer gives a constant dopant depth profile and/or defect depth profile or a substantially constant dopant depth profile and/or defect depth profile. This is understood to mean profiles with a deviation from a perfectly flat dopant depth profile and/or defect depth profile of less than 20% and preferably less than 10%. In reality, the plateau is adjoined by a declining flank, i.e. the decline in the profile is not vertical or abrupt in the region of the doping depth.

In an alternative configuration, the doping of the first layer affords a dopant depth profile and/or defect depth profile that declines in steps, wherein the steps are formed in a near-surface region of the first layer which faces the ion beam by up to 40%, preferably up to 30%, of the total depth of the first layer.

Preferably, a difference in concentration here between the highest and lowest steps is at least a factor of 10, preferably at least a factor of 100, more preferably at least a factor of 500, especially preferably at least a factor of 1000.

The depthwise extent of the flank regions of the steps is predominant here over the depthwise extent of the stepped plateaus.

In an alternative configuration, the doping of the first layer affords a continuously declining dopant depth profile and/or defect depth profile.

It is preferable here when the continuously declining dopant depth profile and/or defect depth profile is a profile according to the following formula:

$$D(z) = D_{max} \cdot \left(1 - \frac{1}{\sqrt{1 + \propto \cdot \left(1 - \frac{z}{b}\right)}} \cdot f\right) + D_0$$

wherein $D_{max}$ is the maximum doping concentration,

α is a value between 10 and 10 000, z is the distance from the surface, b is the layer thickness, f is a tolerance factor between 0.95 and 1.05, $D_0$ is the background doping, wherein $$D_{max} \geq \frac{\varepsilon_r \varepsilon_0 E_{max}}{2 e_0 V_{br}}$$

wherein $E_{max}$ is the maximum field, $\varepsilon_r$ is the relative dielectric constant of the semiconductor, $\varepsilon_0$ is the dielectric constant in a vacuum, $e_0$ is the elementary charge of the electron, $V_{br}$ is the breakthrough voltage, and wherein $$b \geq \frac{3 V_{br}}{2 E_{max}}$$

In general, preference is given to the further step of creating a contact layer in a surface region of the first layer, or of applying a contact layer to the surface of the first layer, wherein the bonding between the donor substrate and acceptor substrate is established via the contact layer, resulting in the following sequence: acceptor substrate, contact layer, remaining portion of first layer or first layer, remaining portion of the donor substrate. This can achieve a particularly good, low resistance connection between donor substrate and acceptor substrate.

The contact layer is preferably created by ion implantation.

Preferably, a dopant concentration in the contact layer is at least 100 times, preferably at least 1000 times, more preferably at least 10 000 times, even more preferably at least 100 000 times, greater than an average dopant concentration in the remainder of the first layer or in the first layer. This achieves a very low-resistance bond, and punch-through of the field to the interface in the semiconductor component is prevented.

In a preferred configuration, a dopant concentration in the contact layer is more than 1E17 $cm^{-3}$, more preferably more than 1E19 $cm^{-3}$.

The intended breakage site is preferably in the region of the first layer, more preferably in an end region of the first layer close to the predetermined doping depth, wherein the end region is more preferably not thicker than 1 μm. In this way, a minimum amount of doped material remains on the donor substrate after the splitting.

In an alternative configuration, the intended breakage site is in the region of the remaining portion of the donor substrate, and, in addition, after step e), the further step of performing ion implantation into the composite substrate is performed from the side remote from the acceptor substrate. This has the advantage that an active zone with a greater total thickness can be formed. On account of the overlap that is enabled thereby between two different implantations, it is also possible to create different preferred doping profiles.

In the context of this alternative configuration, it is preferable that the ion implantation into the composite substrate provides a dopant depth profile and/or defect depth profile in a supplementary doped layer that extends at least up to the doped layer.

The ion implantation into the composite substrate is preferably performed in such a way that the combination of the two dopant depth profiles and/or defect depth profiles of the doped layer and of the supplementary doped layer is a constant profile, a profile that rises stepwise toward the acceptor substrate, or a profile that rises continuously toward the acceptor substrate.

Obliquely declining flanks in the transition region of the two dopant depth profiles and/or defect depth profiles of the doped layer and of the supplementary doped layer may overlap one another.

Preference is given to creating the intended breakage site by ion implantation of split-triggering ions.

The split-triggering ions are preferably introduced over the entire width of the donor substrate in order to create a very uniform separation surface.

Alternatively, the split-triggering ions may be introduced only over a portion of the width of the donor substrate. This reduces complexity in the ion implantation.

Preference is given to introducing the split-triggering ions only in an edge region of the donor substrate.

In preferred embodiments, the split-triggering ions are selected from the following: H, $H_2$, He, B.

In principle, it is advantageous when the split-triggering ions are high-energy ions having an energy between 0.5 and 10 MeV, preferably between 0.5 and 5 MeV, more preferably between 0.5 and 2 MeV.

A particle dose of the split-triggering ions is preferably in each case between 1E15 $cm^{-2}$ and 5E17 $cm^{-2}$. This dose achieves reliable splitting.

The energy spread ($\Delta E/E$) of the ion beam of the split-triggering ions is preferably less than $10^{-2}$, more preferably less than $10^{-4}$. In this way, it is ensured that the intended breakage site has minimum thickness, and the energy loss peak of the ions at the intended breakage site is very sharp.

The splitting of the donor substrate is preferably triggered by a thermal treatment of the composite substrate at a temperature of between 600° C. and 1300° C., preferably between 750° C. and 1200° C., more preferably between 850° C. and 1050° C. Alternatively, mechanical methods are also conceivable.

In a preferred embodiment, the bonding is established by a thermal treatment of the composite substrate at a temperature of between 800° C. and 1600° C., preferably between 900° C. and 1300° C.

It is conceivable that the method is simplified in that both the establishment of the bonding and the splitting of the donor substrate are effected by a thermal treatment, with both steps being conducted simultaneously.

Preferably, the step of establishing the bonding is preceded by a pretreatment of at least one, preferably both, of the surfaces to be bonded, especially a wet-chemical treatment, plasma treatment or ion beam treatment.

The acceptor substrate is preferably thermally stable up to at least 1500° C. and has a coefficient of linear expansion that deviates by not more than 20%, preferably by not more than 10%, from the coefficient of linear expansion of SiC. This effectively prevents bending of the composite substrate.

In a particularly preferred configuration, the acceptor substrate is formed from polycrystalline SiC or graphite.

Preferably, the step of splitting is followed by an after-treatment of the surface of the composite substrate in the region of the intended breakage site, especially by polishing and/or removal of (near-surface) defects.

In a preferred extension of the method, implantation defects in the pretreated composite substrate are annealed at temperatures between 1500° C. and 1750° C. This can be accomplished during the production of the pretreated composite substrate or else only later in the further processing into an electrical component.

The pretreated composite substrate in accordance with an aspect of the invention which serves as a basis for further processing into electronic semiconductor components comprises an acceptor substrate and a doped layer of monocrystalline SiC bonded thereto.

The doped layer preferably has implantation defects.

It is preferable that the doped layer has a thickness of 3 μm to 25 μm, more preferably of 3 μm to 15 μm.

In a preferred configuration, the doped layer is composed of SiC of the 4H, 6H or 3C polytype.

Preferably, a surface of the doped layer has a deviation of less than 6°, preferably less than 3°, more preferably 0°, from a perpendicular to the c direction.

It is preferable that the doped layer has p or n doping with a doping concentration of 1E15 $cm^{-3}$ to 5E17 $cm^{-3}$.

The doped layer is preferably doped with ions of one of the following elements: N, P, B or Al.

The doped layer preferably has a substantially constant dopant depth profile and/or defect depth profile.

Preferably, the doped layer has a dopant depth profile and/or defect depth profile that rises stepwise in the direction towards the acceptor substrate, wherein the steps are formed in a region of the doped layer facing the acceptor substrate by up to 40%, preferably up to 30%, of the total depth of the doped layer.

It is also preferable that a difference in concentration between the highest and lowest steps is at least a factor of 10, preferably at least a factor of 100, more preferably at least a factor of 500, especially preferably at least a factor of 1000.

It is further preferable that the depthwise extent of the flank regions of the steps is predominant over the depthwise extent of the stepped plateaus.

Preferably, the doped layer affords a dopant depth profile and/or defect depth profile that rises continuously in the direction towards the acceptor substrate.

The continuously rising dopant depth profile and/or defect depth profile is preferably a profile according to the following formula:

$$D(z) = D_{max} \cdot \left(1 - \frac{1}{\sqrt{1 + \alpha \cdot \left(1 - \frac{z}{b}\right)}} \cdot f\right) + D_0$$

wherein $D_{max}$ is the maximum doping concentration, $\alpha$ is a value between 10 and 10 000, z is the distance from the surface, b is the layer thickness, f is a tolerance factor between 0.95 and 1.05, $D_0$ is the background doping, wherein $$D_{max} \geq \frac{\varepsilon_r \varepsilon_0 E_{max}}{2 e_0 V_{br}}$$

wherein $E_{max}$ is the maximum field, $\varepsilon_r$ is the relative dielectric constant of the semiconductor, $\varepsilon_0$ is the dielectric constant in a vacuum, $e_0$ is the elementary charge of the electron, $V_{br}$ is the breakthrough voltage, and wherein $$b \geq \frac{3V_{br}}{2E_{max}}$$

The stepped profile mentioned, or the continuously rising profile, takes two aspects into account. Firstly, this dopant profile achieves an optimal compromise between the on-resistance and the given voltage stability. Secondly, the doping profile close to the acceptor substrate has such a high concentration that field punch-through to the interface is ruled out.

In one embodiment, in addition to the doped layer, a supplementary doped layer of monocrystalline SiC is provided, with an overlap region of the respective dopant depth profiles and/or defect depth profiles present in a transition section between the doped layer and the supplementary doped layer. The two dopant depth profiles and/or defect depth profiles have overlapping obliquely declining flanks. The combination of the two dopant depth profiles and/or defect depth profiles of the doped layer and of the supplementary doped layer may be a constant profile, a profile that rises stepwise toward the acceptor substrate, or a profile that rises continuously toward the acceptor substrate.

Preferably, the doped layer and the supplementary doped layer are doped with the same type of ion. The combined thickness of the doped layer and the supplementary doped layer is up to 40 μm.

It is preferable that the acceptor substrate is thermally stable up to at least 1500° C. and has a coefficient of linear expansion that deviates by not more than 20%, preferably by not more than 10%, from the coefficient of linear expansion of SiC.

In a particularly preferred configuration, the acceptor substrate is formed from polycrystalline SiC or graphite.

DETAILED DESCRIPTION OF SPECIFIC EMBODIMENTS

Figure 1:
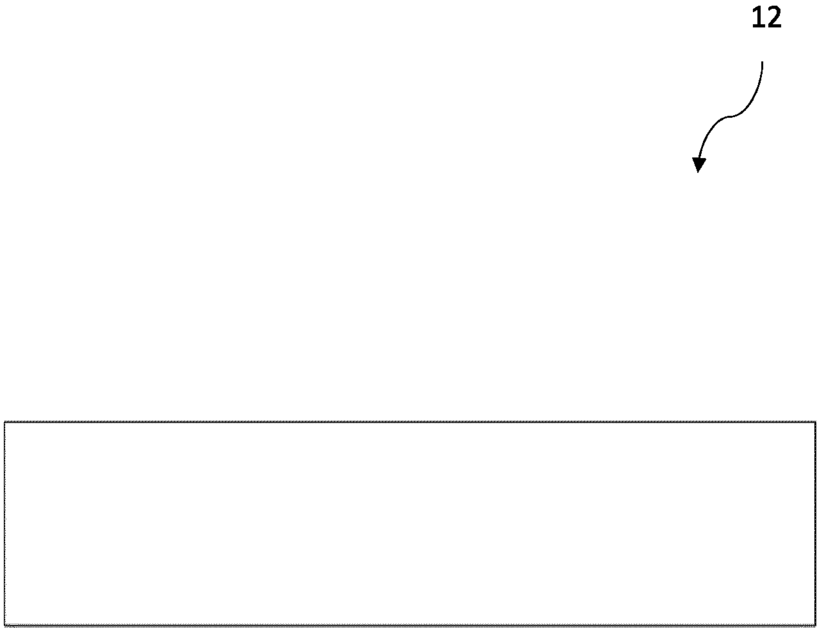
FIG. 1 is a schematic cross-sectional view of a first configuration of the donor substrate which can be used in the method according to an aspect of the invention.
Figure 2:
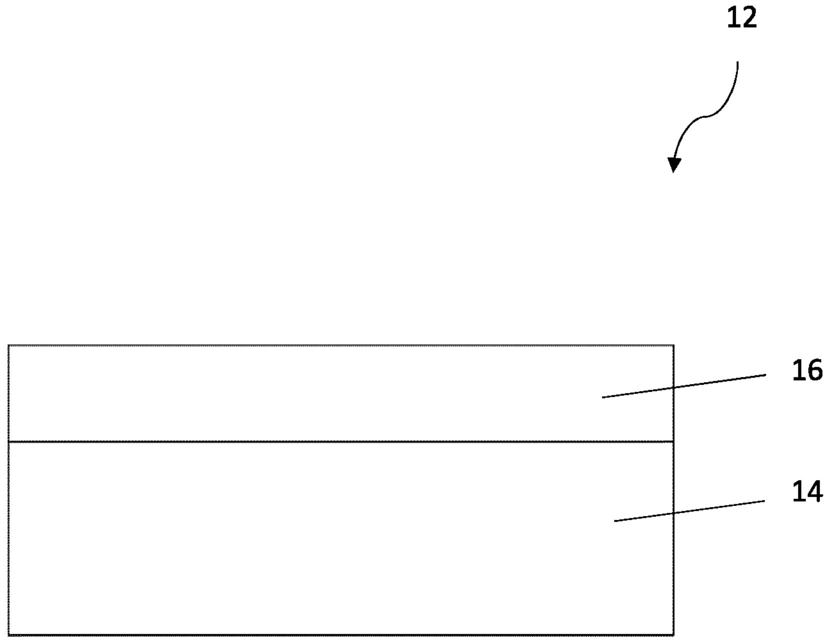
FIG. 2 is a schematic cross-sectional view of a second configuration of the donor substrate which can be used in the method according to an aspect of the invention.

The method according to an aspect of the invention for producing a pretreated composite substrate commences with the provision of a donor substrate 12 including or consisting entirely of monocrystalline silicon carbide (SiC), see FIGS. 1 and 2.

The embodiment of the donor substrate 12 shown in FIG. 1 is a wafer composed of high-quality semi-insulating SiC material (HQSSiC) of high purity. In particular, this is understood to mean a material wherein the concentration of elemental impurities, for example N, B, P, is less than 5E15 $cm^{-3}$. What is meant by “predominantly” in this connection is that the criterion is applicable virtually throughout the depth profile, but there may be variances in particular regions, for example at the surface.

Figure 16:
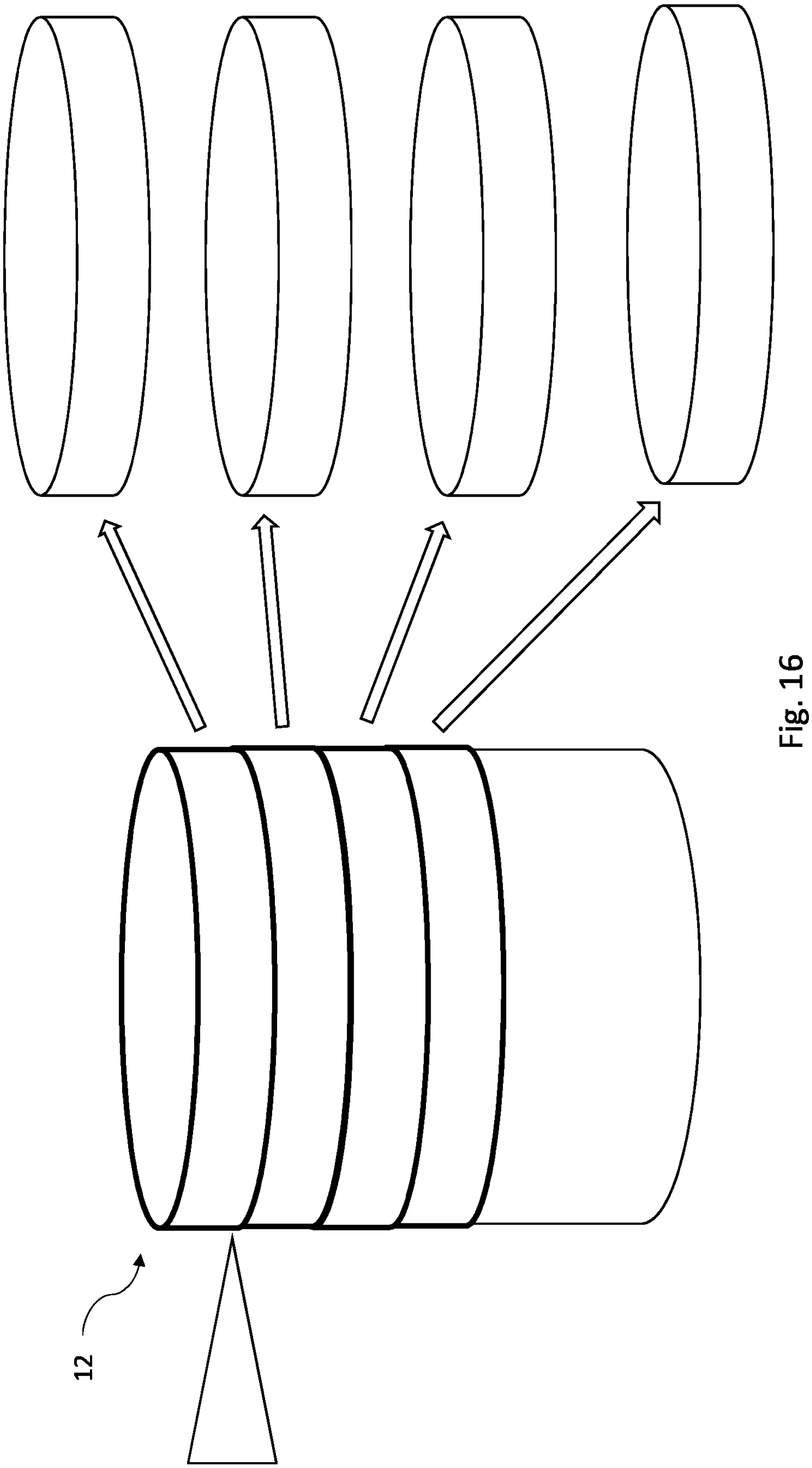
FIG. 16 is a schematic diagram of the splitting of a wafer bar that functions as donor substrate when used for the multiple creation of a composite substrate from a donor substrate.

The donor substrate 12 according to FIG. 1 preferably has a thickness of more than 100 μm, preferably more than 200 μm, more preferably more than 300 μm, up to 15 cm, preferably up to 10 cm. It may especially take the form of an undoped or weakly n-doped wafer bar; see FIG. 16.

In a preferred embodiment, the donor substrate is composed of SiC of the 4H, 6H or 3C polytype. These polytypes have been found to be advantageous for the characteristics of the semiconductor components to be produced therewith.

In the embodiment shown, the upper surface of the donor substrate 12 has a deviation of 0° from a perpendicular to the c direction. Alternatively possible are deviations of up to 3° or up to 6° from a perpendicular to the c direction.

The embodiment of the donor substrate 12 shown in FIG. 2 is a wafer having a carrier wafer 14, preferably composed of SiC, and an epitaxial layer 16 composed of SiC, wherein the epitaxial layer 16 is undoped or has doping of less than 1E15 $cm^{-3}$, preferably less than 1E14 $cm^{-3}$. The epitaxial layer here is preferably composed of SiC of the 4H, 6H or 3C poly-type.

In this case, it is preferable that the epitaxial layer 16 has a thickness of more than 10 μm, preferably more than 50 μm, more preferably more than 80 μm. The maximum thickness of such epitaxial layers 16 is generally 120 μm.

It is preferable here when the upper surface of the epitaxial layer 16 has a deviation of less than 6°, more preferably less than 3°, even more preferably 0°, from a perpendicular to the c direction.

After the donor substrate 12 has been provided, a first layer 21 in the donor substrate 12 is doped (see FIG. 6), which, in the finished component, later assumes or partly assumes the function of the drift zone (also called active zone or voltage-absorbing zone). This doping of the first layer 21 in the donor substrate 12 is effected by ion implantation using an energy filter 20. The corresponding fundamental construction is shown in FIG. 3.

Figure 3:
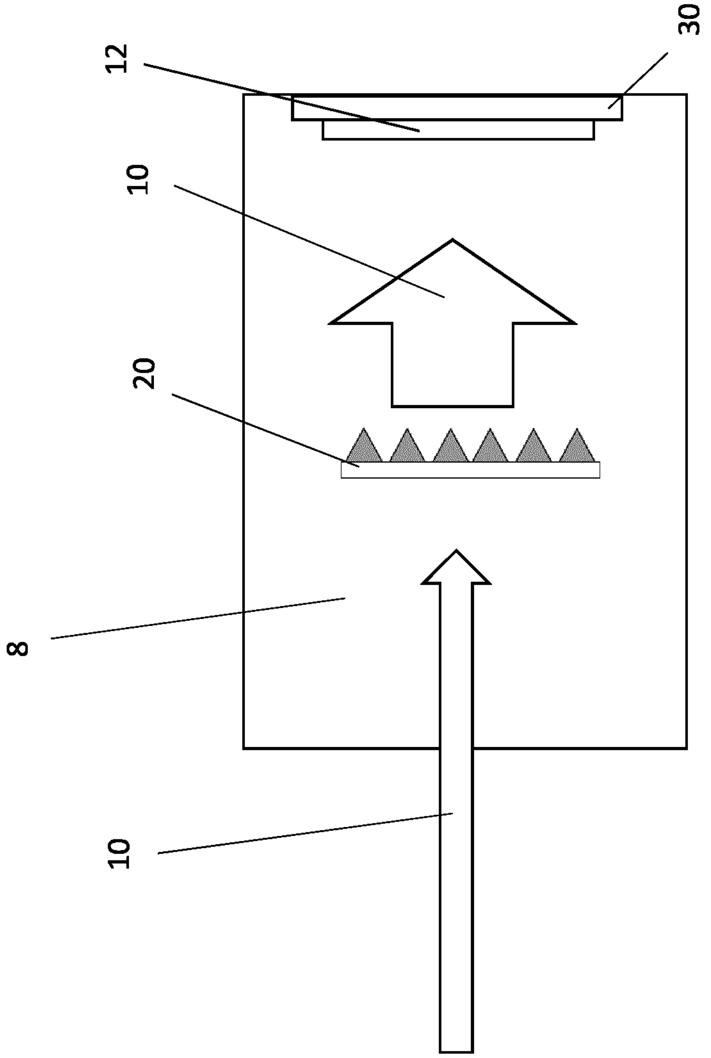
FIG. 3 is a schematic view of an irradiation arrangement with an energy filter for irradiation of the donor substrate.

FIG. 3 shows an irradiation chamber 8 in which there is typically a high vacuum. The irradiation chamber 8 accommodates the donor substrate 12 to be doped in a substrate holder 30.

An ion beam 10 is generated by means of a particle accelerator (not shown) and guided into the irradiation chamber 8. The energy of the ion beam 10 is spread out there by means of an energy filter 20 and hits the donor substrate 12 to be irradiated. Alternatively, the energy filter 20 may be arranged in a separate vacuum chamber closable with valves within the irradiation chamber 8 or immediately adjacent to the irradiation chamber 8.

The substrate holder 30 need not be stationary, but may optionally be provided with a device for moving the donor substrate 12 in x-y (in the plane perpendicularly to the sheet plane). Another useful substrate holder 30 is also a wafer wheel on which the donor substrates 12 to be implanted are fixed and which turns during the implantation. It is also possible to move the substrate holder 30 in beam direction (z direction). In addition, the substrate holder 30 may optionally be provided with a heater or cooler.

Figure 4:
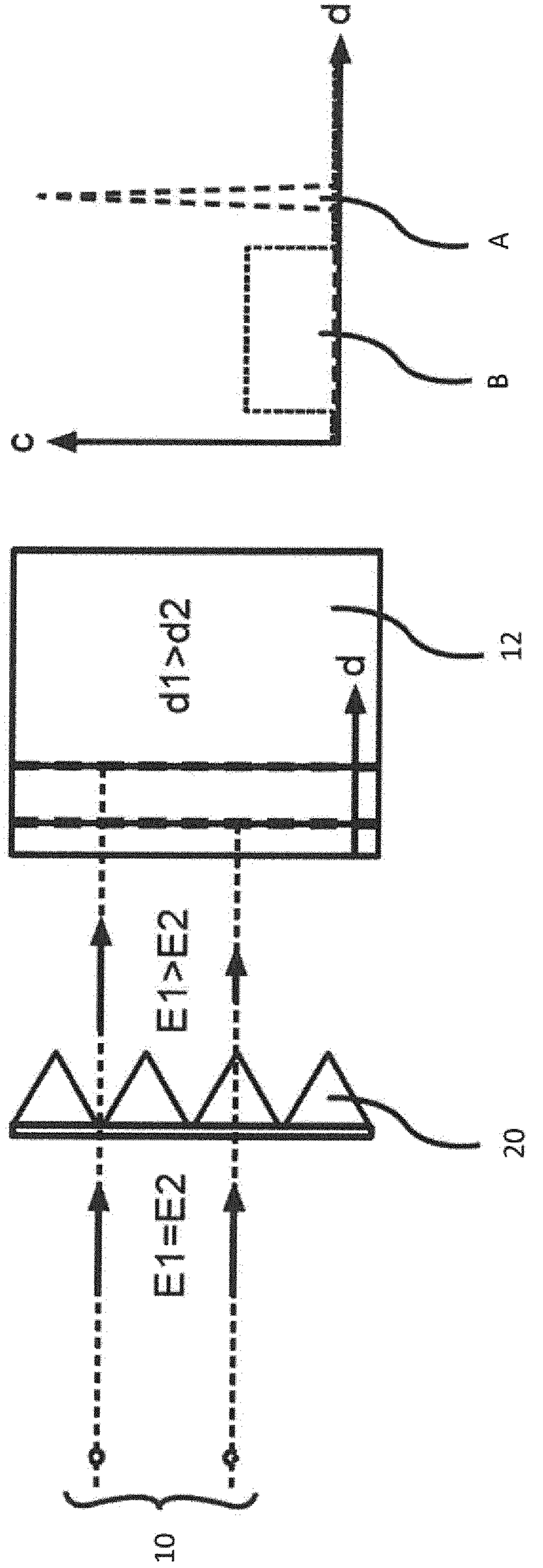
FIG. 4 is a schematic diagram of the mode of action of an energy filter which can be used in the method according to an aspect of the invention.

The basic principle of the energy filter 20 is shown in FIG. 4. The energy of the monoenergetic ion beam 10 is modified as it passes through the energy filter 20 configured as a microstructured membrane, depending on the site of entry. The resulting energy distribution of the ions of the ion beam 10 leads to modification of the depth profile of the implanted substance in the matrix of the donor substrate 12. E1 denotes the energy of a first ion, E2 denotes the energy of a second ion, c denotes the doping concentration, and d denotes the depth in the donor substrate 12. The diagram shows the typical Gaussian distribution on the right with reference sign A, which arises without use of an energy filter 20. By contrast, reference sign B shows, by way of example, a rectangular distribution that can be achieved when an energy filter 20 is used.

Figure 5:
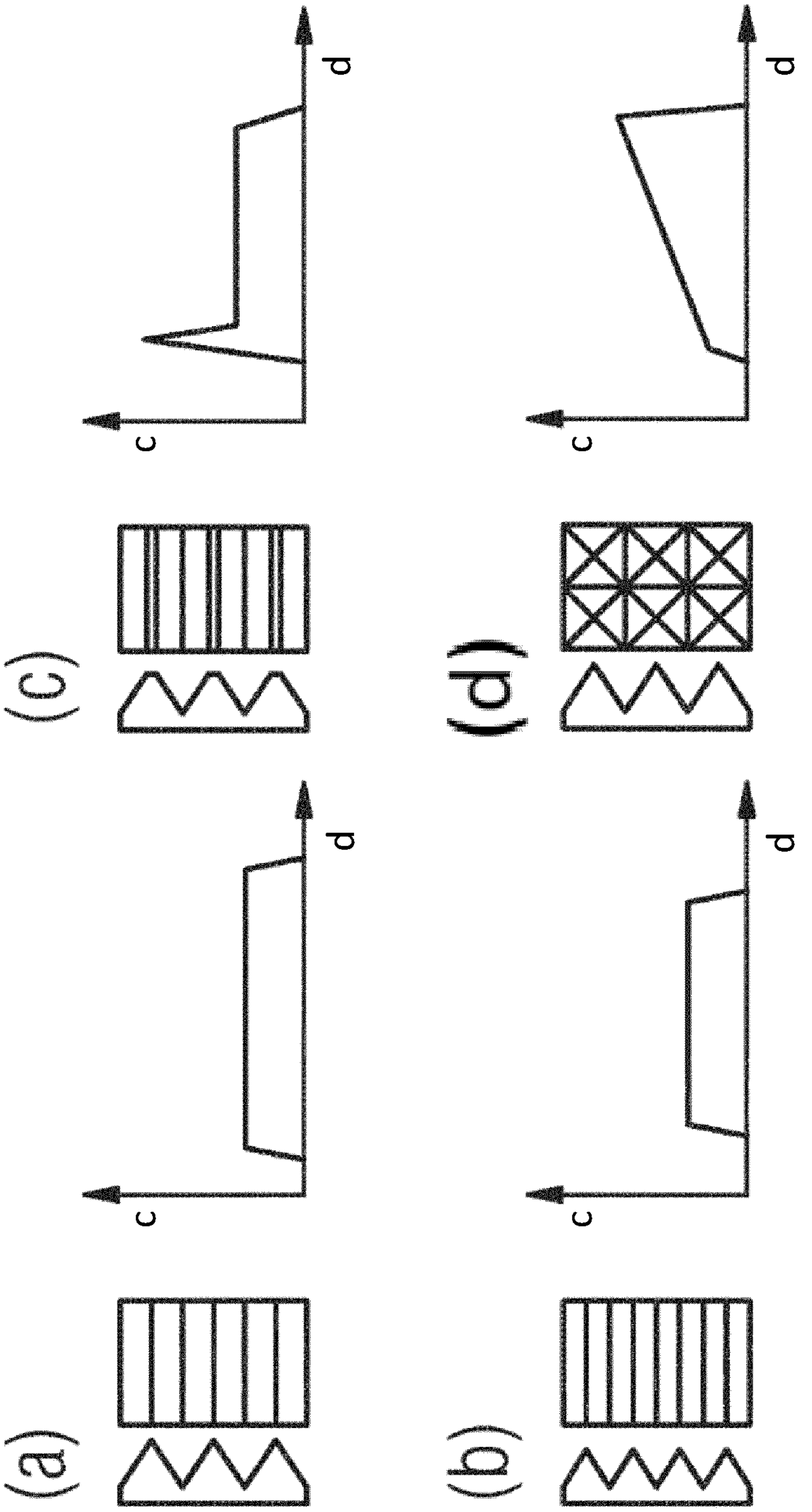
FIG. 5 is a schematic diagram of different doping profiles which can be produced by means of differently structured energy filters.

The layouts or three-dimensional structures of energy filters 20 that are shown in FIG. 5 show the basic options for creating a multitude of dopant depth profiles or defect depth profiles by means of energy filters 20. c again denotes the doping concentration, and d again denotes the depth in the donor substrate 12. The filter structure profiles may in principle be combined with one another in order to obtain new filter structure profiles and hence new dopant depth profiles or defect depth profiles.

Such energy filters 20 are generally produced from silicon. They have a thickness of between 3 μm and 200 μm, preferably between 5 μm and 50 μm, and more preferably between 7 μm and 20 μm. They may be held in a filter frame (not shown). The filter frame may be accommodated exchangeably in a filter holder (not shown).

For the preferred formation of an n-doped first layer 21, implantation with ions of nitrogen or phosphorus is particularly suitable, whereinas, for a p-doped layer, implantation with ions of boron or aluminum is particularly suitable.

Figure 6:
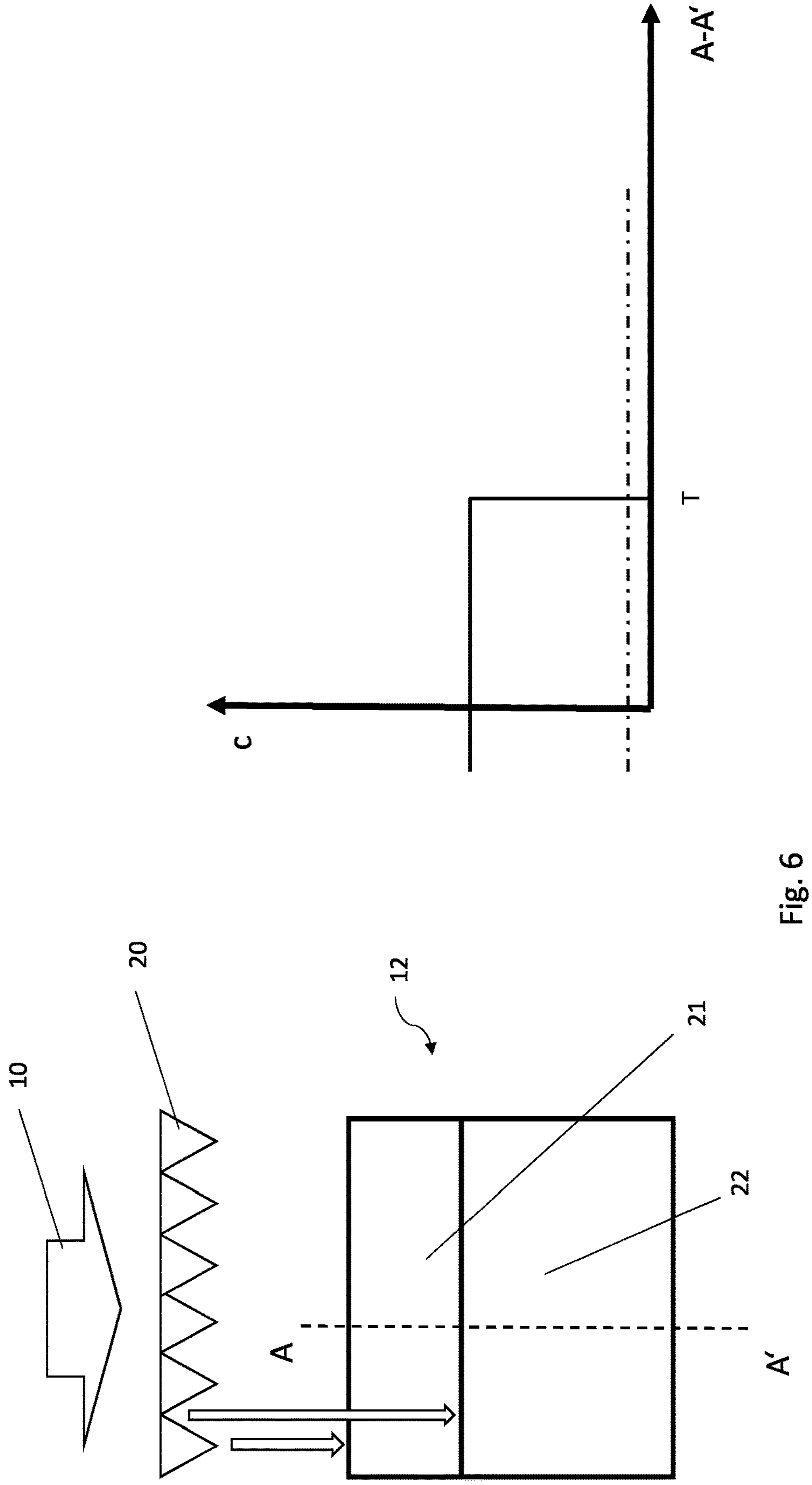
FIG. 6 shows a schematic of the doping profile of the first layer of the donor substrate and a resultant doping profile of the donor substrate.

In the embodiment of the method step of doping the first layer 21 which is shown in FIG. 6, the ions are implanted into the donor substrate 12 from a front side of the donor substrate 12. The short black solid arrow indicates the ions of minimum energy transmitted through the energy filter 20, and the long black solid arrow indicates the ions of maximum energy transmitted through the energy filter 20. The resultant doping profile in the A-A' section is shown on the right in the coordinate system. c represents the doping concentration. The doping profile is based on the configuration of the donor substrate 12 according to FIG. 1 and is approximately uniform across the entire first layer 21. The first layer 21 extends from the surface of the donor substrate 12 that faces the ion beam 10 up to a predetermined doping depth T, followed by a remaining portion 22 of the donor substrate 12 which is unaffected by the ion implantation by energy filter.

The thickness of the first layer 21 preferably corresponds essentially to a previously ascertained thickness of the active layer in the later component or to a combination of active layer plus a field stop layer or to a combination of active layer plus a field stop layer and a superficial functional zone. The total thickness of the first layer 21 is thus determined by the nature and in particular by the voltage class of the semiconductor component to be produced. The higher the voltage class, the thicker the first layer 21. For particularly high voltage classes, reference is made to FIG. 15 and the accompanying description.

The thickness of the first layer 21 is preferably between 3 and 15 μm. This corresponds to the doping depth T which is currently viably possible for the abovementioned preferred ion types in SiC.

Figure 7A:
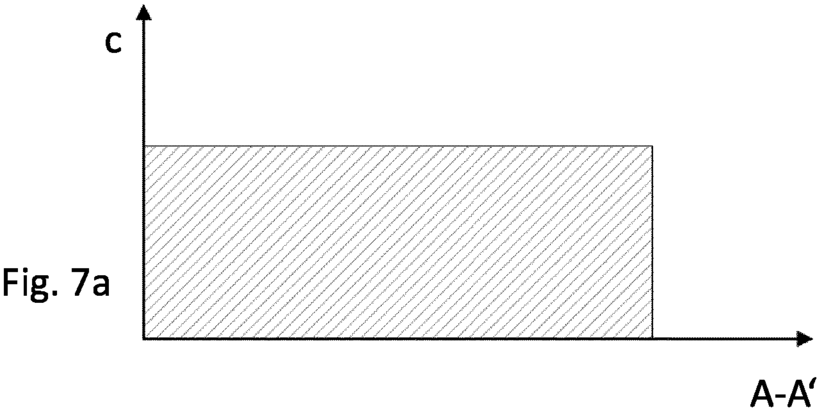
FIG. 7 shows various options for the doping profile of the first layer of the donor substrate.
Figure 7B:
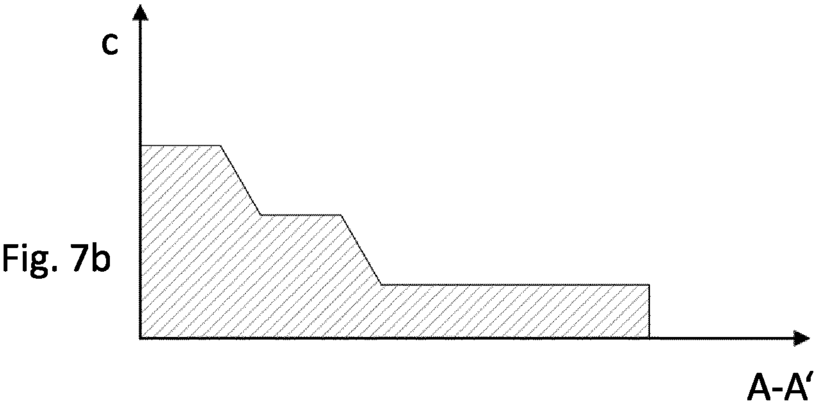
Figure 7C:
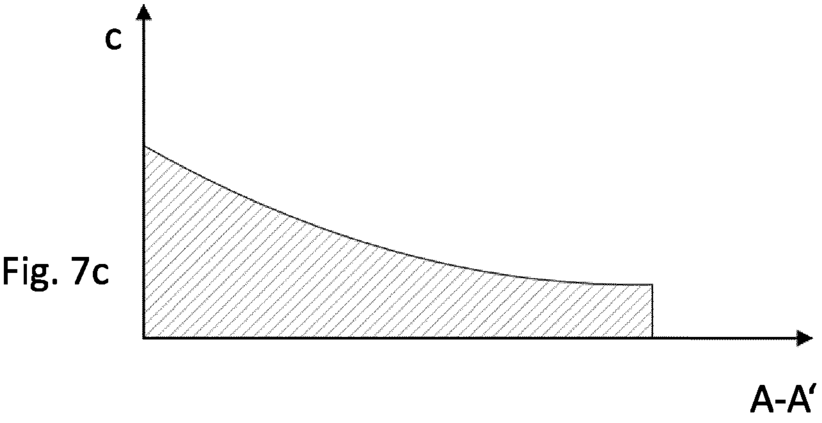

FIGS. 7*a* to 7*c* show possible preferred doping profiles in the first layer 21 of the donor substrate 12.

In principle, the doping of the first layer 21 affords p or n doping with a doping concentration or defect concentration in the first layer 21 of 1E15 $cm^{-3}$ to 5E17 $cm^{-3}$.

Figure 8:
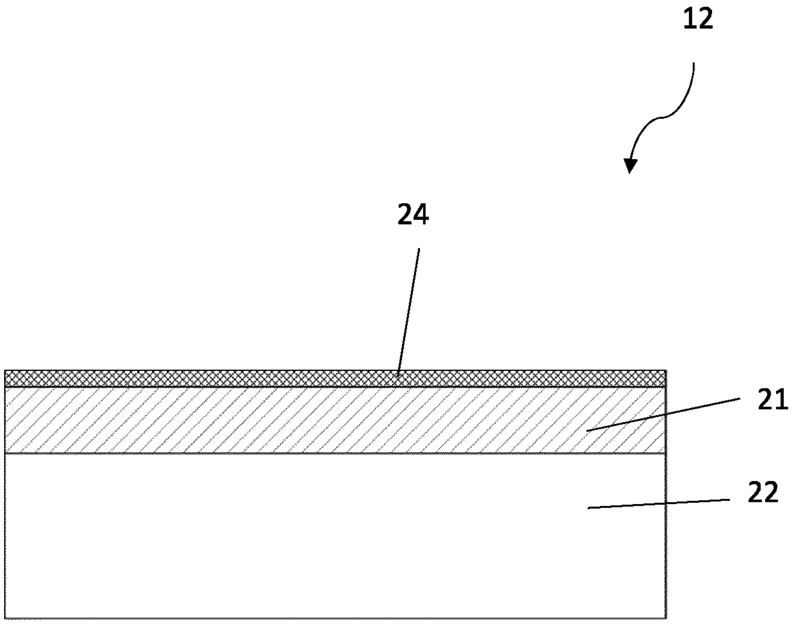
FIG. 8 shows a schematic of the creation or application of a contact layer in the donor substrate.

FIG. 8 shows the result of the optional step of creating a contact layer 24 in a surface region of the first layer 21 or of applying a contact layer 24 to the surface of the first layer 21.

Preference is given to creating the contact layer 24 by ion implantation into the first layer 24. The contact layer 24 has a thickness of only 10 nm up to 1 μm. For the implantation, preference is given to using ions of P, N or Al (without an energy filter).

The dopant concentration in the contact layer 24 is preferably at least 100 times, more preferably at least 1000 times, more preferably at least 10 000 times, even more preferably at least 100 000 times, greater than an average dopant concentration in the remainder of the first layer 21 or in the first layer 21.

The dopant concentration in the contact layer 24 is preferably more than 1E17 $cm^{-3}$, more preferably more than 1E19 $cm^{-3}$.

It is also possible to apply a thin contact layer 24, for example of a few nanometers in thickness, to the first layer 21. This is accomplished, for example, by sputtering deposition, vapor deposition or a CVD deposition method. The contact layer 24 need not be completely covering; it may also consist of nanoparticles.

Simultaneously with or after application of the contact layer 24, a further treatment of the surface may take place, for example physical etching.

Figure 9:
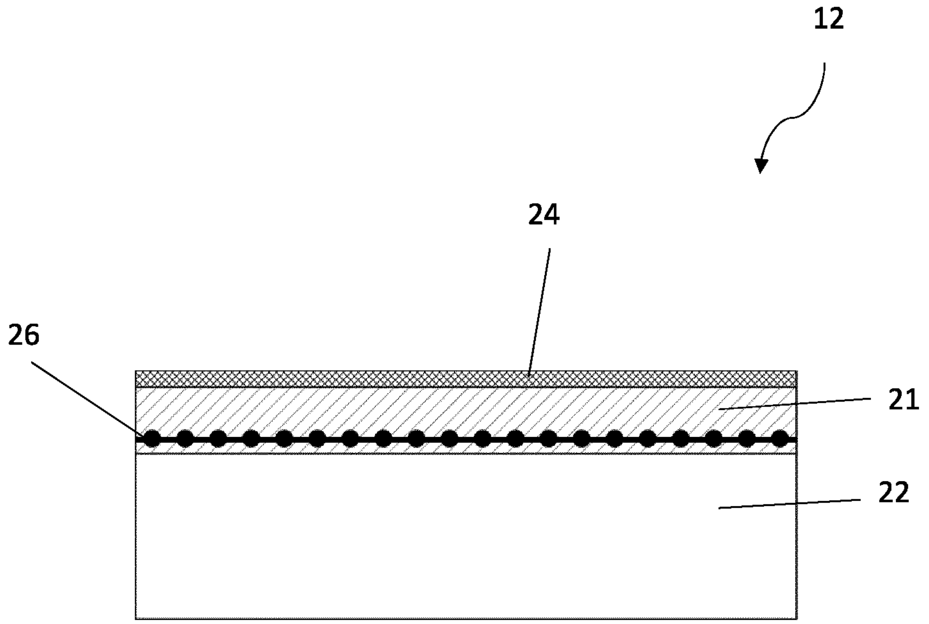
FIG. 9 shows a schematic of a first variant of the creation of an intended breakage site in the donor substrate.

In the next step, according to FIG. 9, an intended breakage site 26 is created in the donor substrate 24. The intended breakage site 26, in the example of FIG. 9, is in the region of the first layer 21, preferably in an end region of the first layer 21 close to the predetermined doping depth T, wherein the intended breakage site 26 is distanced from the doping depth T and hence from the end of the first layer 21 by preferably not more than 1 μm, more preferably not more than 500 nm, more preferably not more than 100 nm. Especially in the case of rectangular profiles with a declining flank, the intended breakage site 26 should still be in the region of the plateau.

The intended breakage site 26 is preferably created by ion implantation of split-triggering ions, which are shown schematically as black dots in FIG. 9. No energy filter is used here. According to FIG. 9, the split-triggering ions are introduced over the entire width of the donor substrate 12. The split-triggering ions are preferably selected from the following: H, $H_2$, He, B. The split-triggering ions are high-energy ions having an energy between 0.5 and 10 MeV, preferably between 0.5 and 5 MeV, more preferably between 0.5 and 2 MeV. For hydrogen, in the case of an ion energy of 0.6 MeV, the intended breakage site 26 is formed at a depth of about 5 μm, in the case of an ion energy of 1.0 MeV at a depth of about 10 μm, and in the case of an ion energy of 1.5 MeV at a depth of about 20 μm.

A particle dose of the split-triggering ions is preferably in each case between 1E15 $cm^{-2}$ and 5E17 $cm^{-2}$. The energy spread ($\Delta E/E$) of the ion beam of the split-triggering ions is preferably less than 10−2, more preferably less than $10^{-4}$. In the implantation of the split-triggering ions, it is advantageous when the temperature in the donor substrate 12 remains below 300° C., preferably below 200° C. For this purpose, the chuck on which the donor substrate 12 lies is optionally cooled.

With these parameters, a doping profile having a sharp peak is created (see the Gaussian distribution identified by A in FIG. 4). In this way, it is ensured that the intended breakage site 26 has high doping distributed over an extremely small thickness. The variation in the penetration of the ions in the donor substrate 12 (longitudinal straggling σ), depending on the primary energy of the ion beam, is only between 100 nm and 500 nm, preferably between 200 nm and 400 nm.

Figure 10:
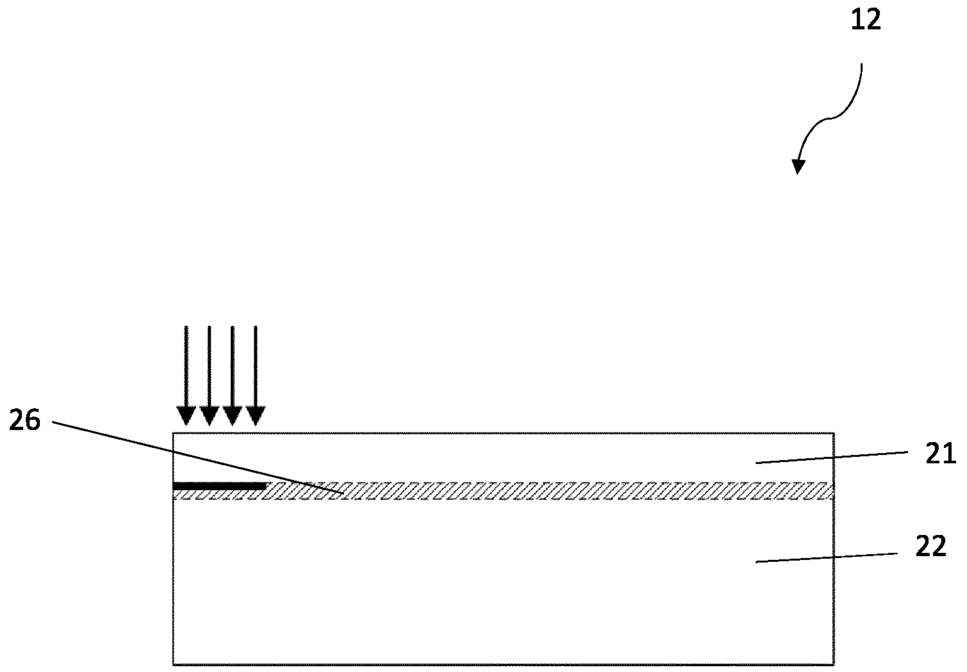
FIG. 10 shows a schematic of a second variant of the creation of an intended breakage site in the donor substrate.

Alternatively, as shown in FIG. 10 by the arrows and the horizontal black bar, the split-triggering ions may be introduced only over part of the width of the donor substrate 12, preferably only in one or both edge regions of the donor substrate 12. In this way, the intended breakage site 26 is predefined in sections.

As an alternative to ion implantation, the intended breakage site 26 may also be formed by electron irradiation or laser irradiation.

Figure 11:
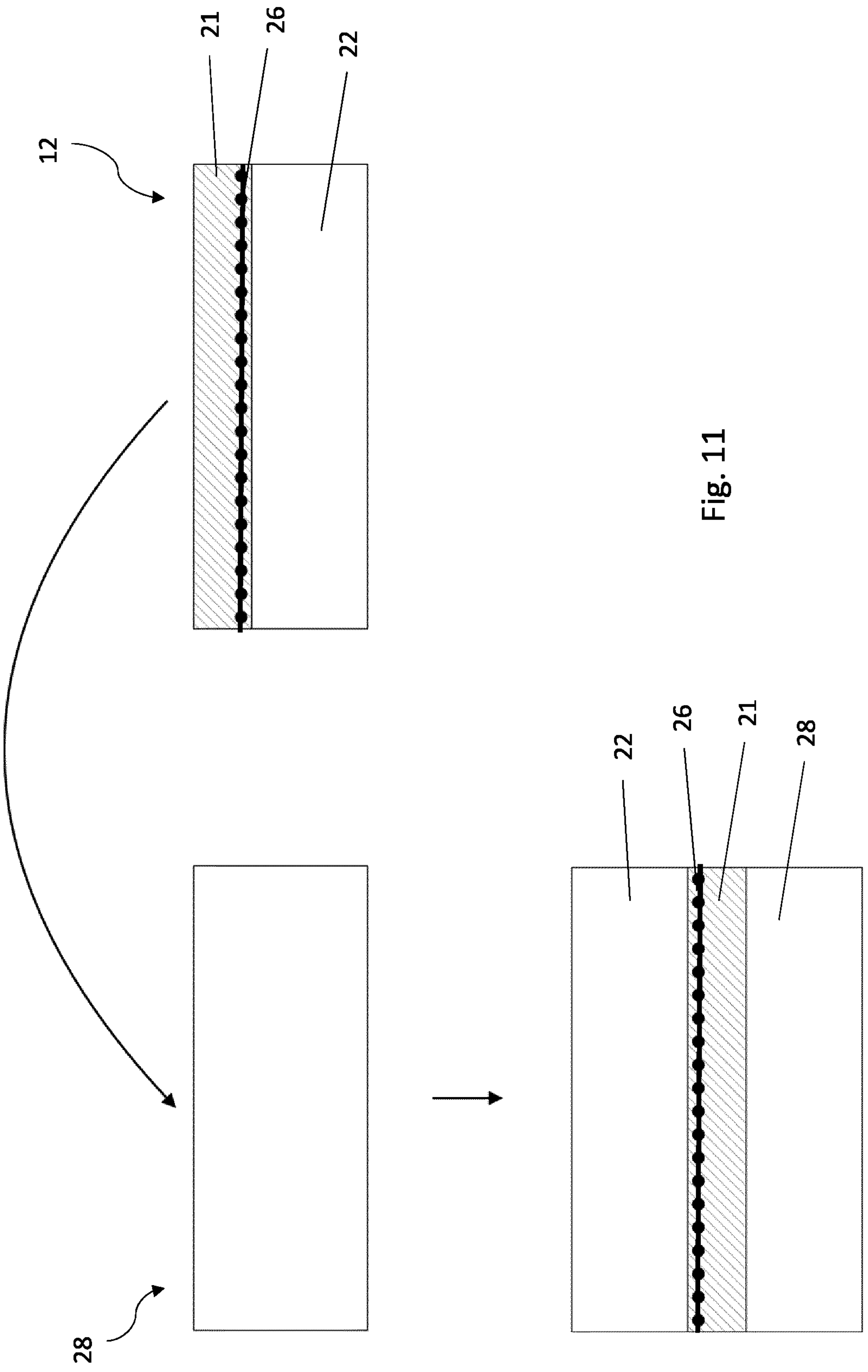
FIG. 11 shows a schematic of the producing of a bond between donor substrate and acceptor substrate.

Subsequently, the donor substrate 12, with the side of the first layer 21 forward, is bonded to the acceptor substrate 28 by means of a bond, as shown in FIG. 11. The first layer 21 is thus arranged in a region between the acceptor substrate 28 and the remaining portion 22 of the donor substrate 12. Whether the donor substrate 12 is moved toward the acceptor substrate 28 for the establishing of the bond, as shown in FIG. 11 by the curved arrow, which also indicates that the donor substrate 12 is turned over, or the acceptor substrate 28 is moved toward the donor substrate 12 is immaterial.

The intermediate result of the bonding process is shown bottom left in FIG. 11. It would like-wise be possible to reverse the layer sequence, for example if the acceptor substrate 28 was moved toward the donor substrate 12.

A whole series of materials are possible for the acceptor substrate 28. The acceptor substrate 28 is preferably thermally stable up to at least 1500° C. and has a coefficient of linear expansion that deviates by not more than 20%, ideally by not more than 10%, from the coefficient of linear expansion of SiC. Suitable examples for the material of the acceptor substrate 28 are polycrystalline SiC or graphite.

FIGS. 10 and 11 do not show the contact layer 24 in each case, but it is preferably present. In that case, the bonding between donor substrate 12 and acceptor substrate 28 is established via the contact layer 24, resulting in the following sequence: acceptor substrate 28, contact layer 24, remaining portion of first layer 21 or first layer 21, remaining portion 22 of the donor substrate 12.

A low-resistance bond is preferably established by a thermal treatment of the substrate obtained as the intermediate result at a temperature of between 800° C. and 1600° C., more preferably between 900° C. and 1300° C.

The step of establishing the bonding may be preceded by a pretreatment of at least one, preferably both, of the surfaces to be bonded, especially a wet-chemical treatment, plasma treatment or ion beam treatment. A treated surface may also be the contact layer 24. Also conceivable is the application of a thin layer, of a few nanometers in thickness, for production of a later low-resistance bond of acceptor substrate 28 and donor substrate 12. In principle, an extremely low-resistance contact and a high-temperature-resistant bond between acceptor substrate 28 and donor substrate 12 is important.

Figure 12:
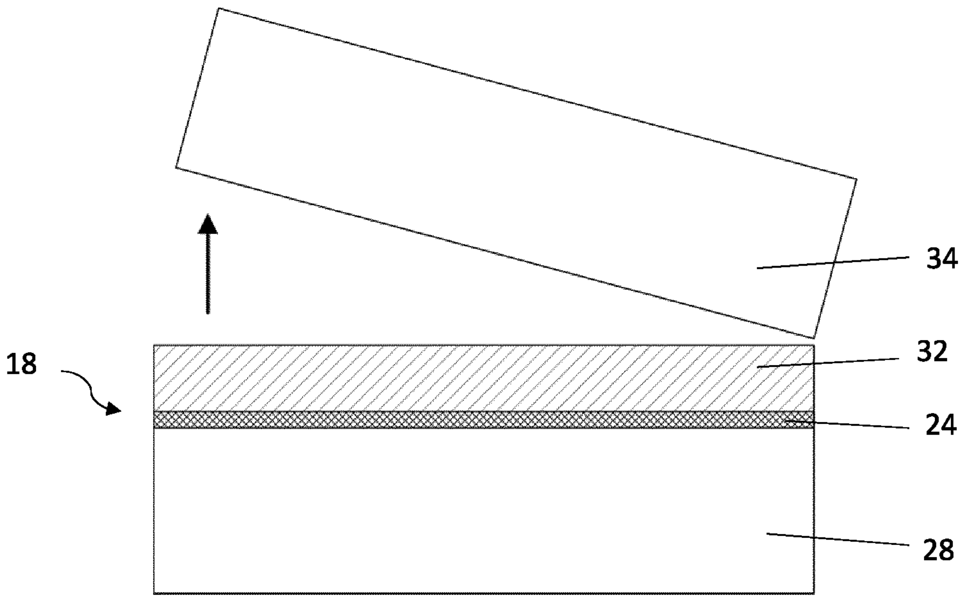
FIG. 12 shows a schematic of the splitting of the remaining portion of the donor substrate from the composite substrate.

FIG. 12 shows a schematic of the step of splitting the donor substrate 12 in the region of the intended breakage site 26, which creates a pretreated composite substrate 18 comprising the acceptor substrate 28 and a doped layer 32 bonded thereto, wherein the doped layer 32 comprises at least a section of the first layer 21 of the donor substrate 12. The portion 34 of the donor substrate 12 split off from the acceptor substrate 28 is removed.

The splitting of the donor substrate 12 is preferably triggered by a thermal treatment of the composite substrate 18 at a temperature of between 600° C. and 1300° C., preferably between 750° C. and 1200° C., more preferably between 850° C. and 1050° C. In one embodiment (see FIGS. 9 and 10), gas bubbles are formed owing to the implanted ions, which coalesce and lead to splitting.

Alternatively, external forces may be exerted on the composite substrate 18, such that the donor substrate 12 breaks up at the intended breakage site 26. A combination of thermal treatment and external forces may also be necessary or helpful. Especially when ions have been introduced into the donor substrate 12 only in sections, the exertion of external forces is unavoidable.

If both the establishing of the bond and the splitting of the donor substrate 12 are effected by a thermal treatment, the two steps can under some circumstances be performed simultaneously.

Figure 13:
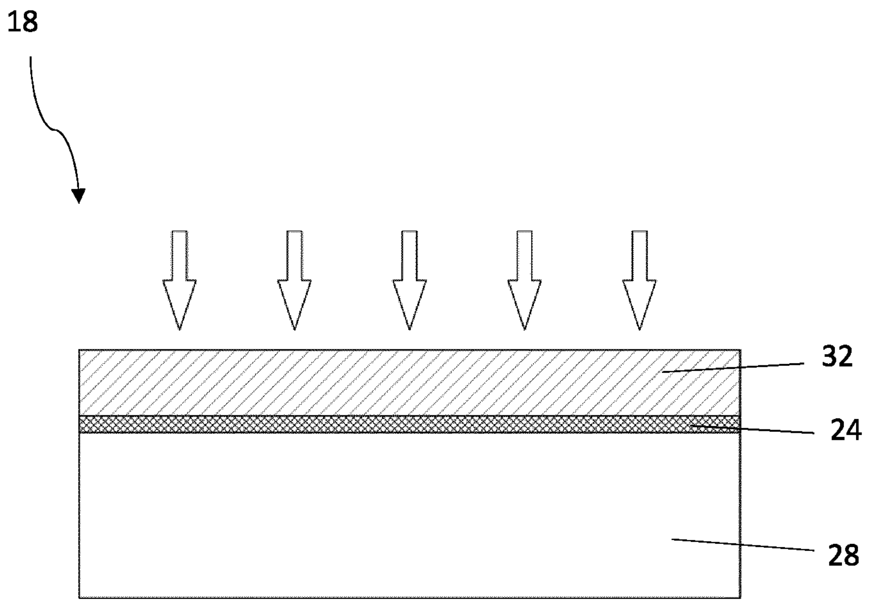
FIG. 13 shows a schematic of the aftertreating of the surface of the composite substrate in the region of the split site.

As shown schematically in FIG. 13 by the arrows, after the step of splitting, there may be an aftertreatment of the surface of the composite substrate 18 in the region of the intended breakage site 26, especially by polishing and/or removing defects.

Figure 14:
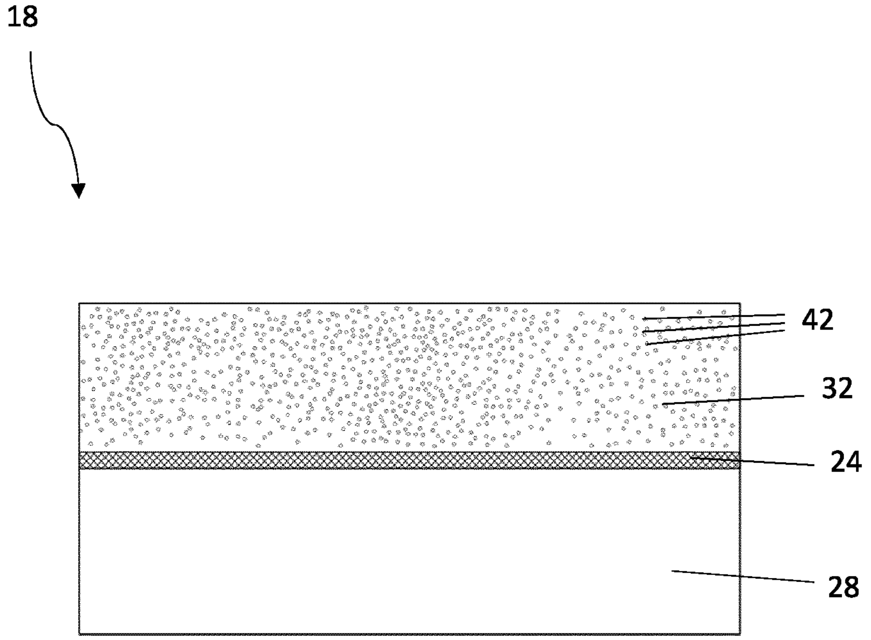
FIG. 14 shows a schematic of a cross section through an embodiment of the pretreated composite substrate according to an aspect of the invention.

Implantation defects 42 that are shown schematically in FIG. 14 may finally be annealed in the doped layer 32 of the pretreated composite substrate 18 at temperatures of preferably between 1500° C. and 1750° C. This is preferably effected during the later component processing in heat treatment steps for annealing of low-energy implantations, e.g. source-drain contact implantation, channel implantation, p-JFET implantation etc.

It is also conceivable that the step of annealing the implantation defects 42 is already conducted during the splitting-off of the portion 34 of the donor substrate 12 and/or during the forming of the bond between donor substrate 12 and acceptor substrate 28 if correspondingly high temperatures are used and the radiation defects can be annealed in that way.

FIGS. 8 to 13 showed and described the method steps so far with a donor substrate 12 according to FIG. 1, but they are performable analogously with donor substrates 12 according to FIG. 2. In that case, it is important that the epitaxial layer 16 of the donor substrate 12 is bonded to the acceptor substrate 28.

In a departure from the description so far, the step of producing the bond between donor substrate 12 and acceptor substrate 28 may also proceed in two stages. First of all, for example, a bonding process may take place with low bonding energy at low temperature and then, in a subsequent second step, solidification to produce a bond with high bond strength or bond energy at higher temperature and low contact resistance. The solidification may, for example, also be effected during or after the splitting, during or after the surface treatment of the composite substrate, or during or after the annealing of implantation defects.

The pretreated composite substrate 18 thus produced, which serves as a basis for further processing into electronic semiconductor components, is shown once again in FIG. 14. It comprises the acceptor substrate 28 and the doped layer 32 of monocrystalline SiC bonded thereto, wherein the doped layer 32 preferably includes the implantation defects 42 (radiation defects). It may also have the contact layer 24 between acceptor substrate 28 and doped layer 32.

The doped layer 32 preferably has a thickness of 3 μm to 30 μm, more preferably of 3 μm to 15 μm. It is preferably composed of SiC of the 4H, 6H or 3C polytype. A surface of the doped layer 32 preferably has a deviation of less than 6°, preferably 0°, from a perpendicular to the c direction. The doped layer 32 preferably has p or n doping with a doping concentration or defect concentration of 1E15 $cm^{-3}$ to 5E17 $cm^{-3}$. The doped layer 32 was preferably doped with ions of one of the following elements as dopant: N, P, B or Al.

The dopant depth profile and/or defect depth profile of the doped layer 32 preferably results essentially from a reversal of the dopant depth profile and/or defect depth profile of the first layer 21 in the donor substrate 12.

The doped layer 32 may thus, for example, have a substantially constant dopant depth profile and/or defect depth profile.

It is likewise possible for the doped layer 32 to have a dopant depth profile and/or defect depth profile that rises in steps in the direction towards the acceptor substrate 28, wherein the steps are formed in a region of the doped layer 32 facing the acceptor substrate 28 by up to 40%, preferably up to 30%, of the total depth of the doped layer 32.

The doped layer 32 may also give a dopant depth profile and/or defect depth profile that rises continuously in the direction towards the acceptor substrate 28.

The implantation defect profile essentially follows the implanted extrinsic atom concentration depth profile.

The acceptor substrate 28 is thermally stable up to at least 1500° C. and has a coefficient of linear expansion that deviates by not more than 20%, preferably by not more than 10%, from the coefficient of linear expansion of SiC. The acceptor substrate 28 is more preferably formed from polycrystalline SiC or graphite.

Figure 15:
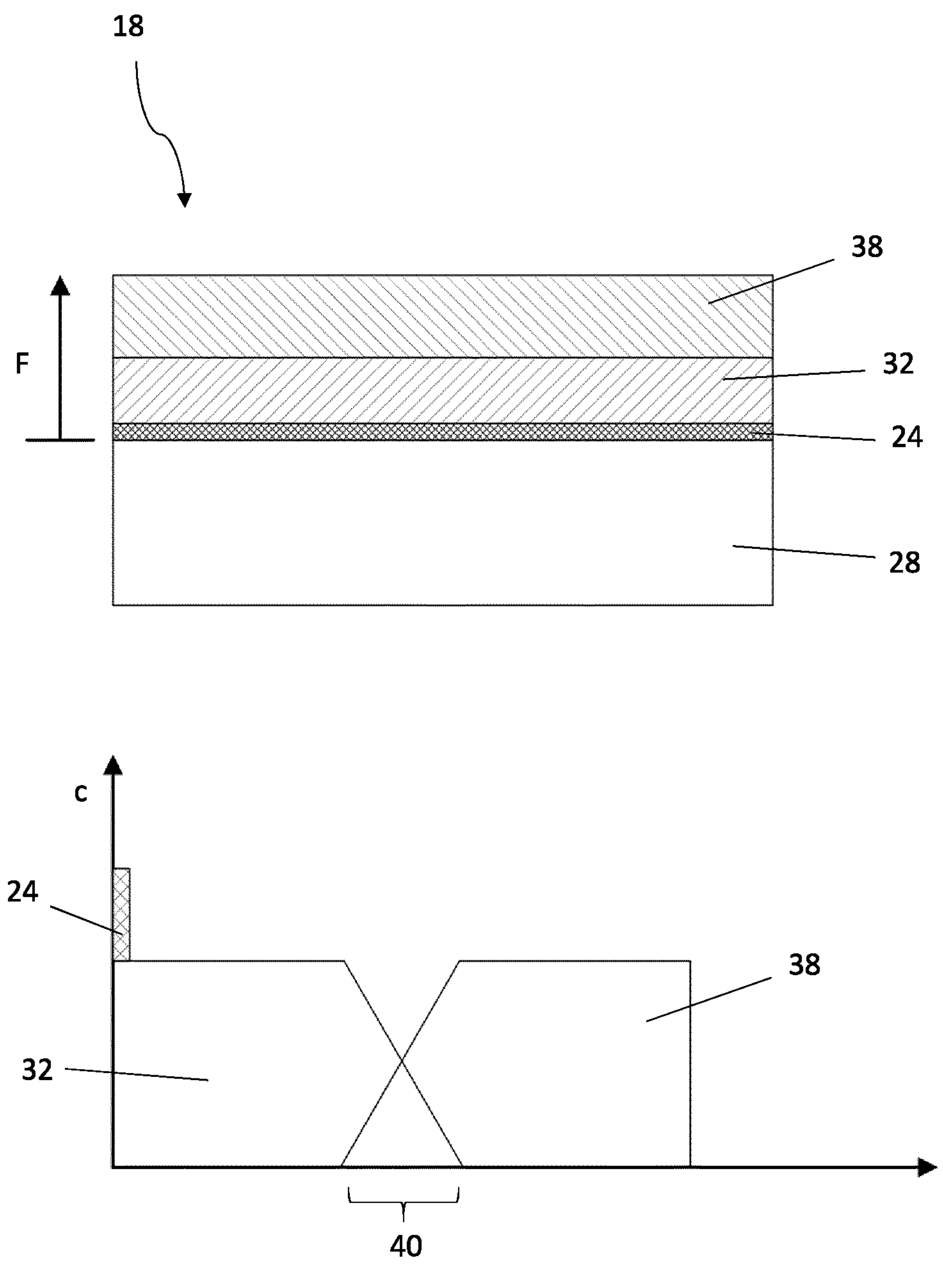
FIG. 15 shows a schematic of a cross section through a further embodiment of the pretreated composite substrate in accordance with an aspect of the invention and the corresponding doping profile.

FIG. 15 shows an alternative configuration of the pretreated composite substrate 18 according to an aspect of the invention in cross section and, below that, a dopant concentration profile along the section of the composite substrate 18 corresponding to arrow F. This is particularly suitable for the production of very highly blocking components, e.g. >1200 V.

In this case, the pretreated composite substrate 18, in addition to the doped layer 32, has a supplementary doped layer 38 of monocrystalline SiC. In a transition section between the doped layer 32 and the supplementary doped layer 38, there is preferably an overlap region 40 of the respective dopant depth profiles and/or defect depth profiles.

In the embodiment shown in FIG. 14, the active layer required (drift zone, voltage-absorbing layer) in the later semiconductor component is formed solely by the doped layer 32 and hence simultaneously by the first layer 21 or a (preferably large) portion of the first layer 21 in the donor substrate 12.

By contrast, the active layer in embodiments as in FIG. 15 is formed by a combination of doped layer 32 and the supplementary doped layer 38. While a substantially constant cumulative doping profile results from superimposition of the two component profiles in FIG. 15, it is also possible for any other doping profiles to be formed by the juxtaposition and partial overlapping of the doping profiles in doped layer 32 and supplementary doped layer 38. It is thus possible for the combined overall doping profile composed of the combination of the two dopant depth profiles and/or defect depth profiles of the doped layer 32 and of the supplementary doped layer 38 also to be a profile that rises stepwise toward the acceptor substrate 28 or a profile that rises continuously toward the acceptor substrate 28.

Such combined profiles are obtained in that the intended breakage site 26 in the donor substrate 12 is created not within the first layer 21 but within the remaining portion 22 of the donor substrate 12 that has not been doped by ion implantation into the donor substrate 12.

After the splitting at the intended breakage site 26 as in FIG. 12, the doping of the supplementary doped layer 38 can then be conducted from the side remote from the acceptor substrate 28 by further ion implantation by means of an energy filter. The statements relating to ion implantation by means of an energy filter that have been made above with regard to FIGS. 3 to 7 are identically applicable to the ion implantation into the supplementary doped layer 38. The thickness of the supplementary doped layer 38 is generally between 3 and 15 μm. Total thicknesses of the active zone doped by ion implantation of up to 30 μm are thus obtained.

In principle, it is possible by the method according to an aspect of the invention to produce two or more composite substrates 18, or even a multitude of composite substrates 18, from a donor substrate 12, provided that the donor substrate 12 from FIG. 1 or the epitaxial layer 16 of the donor substrate 12 from FIG. 2 is at least twice as thick as the thickness of the doped layer 32 required in the composite substrate 18. This effect is particularly high in the case of a thick wafer bar as donor substrate 12. In this way, it is possible to save considerable costs in production. This is shown schematically in FIG. 16.

Figure 17:
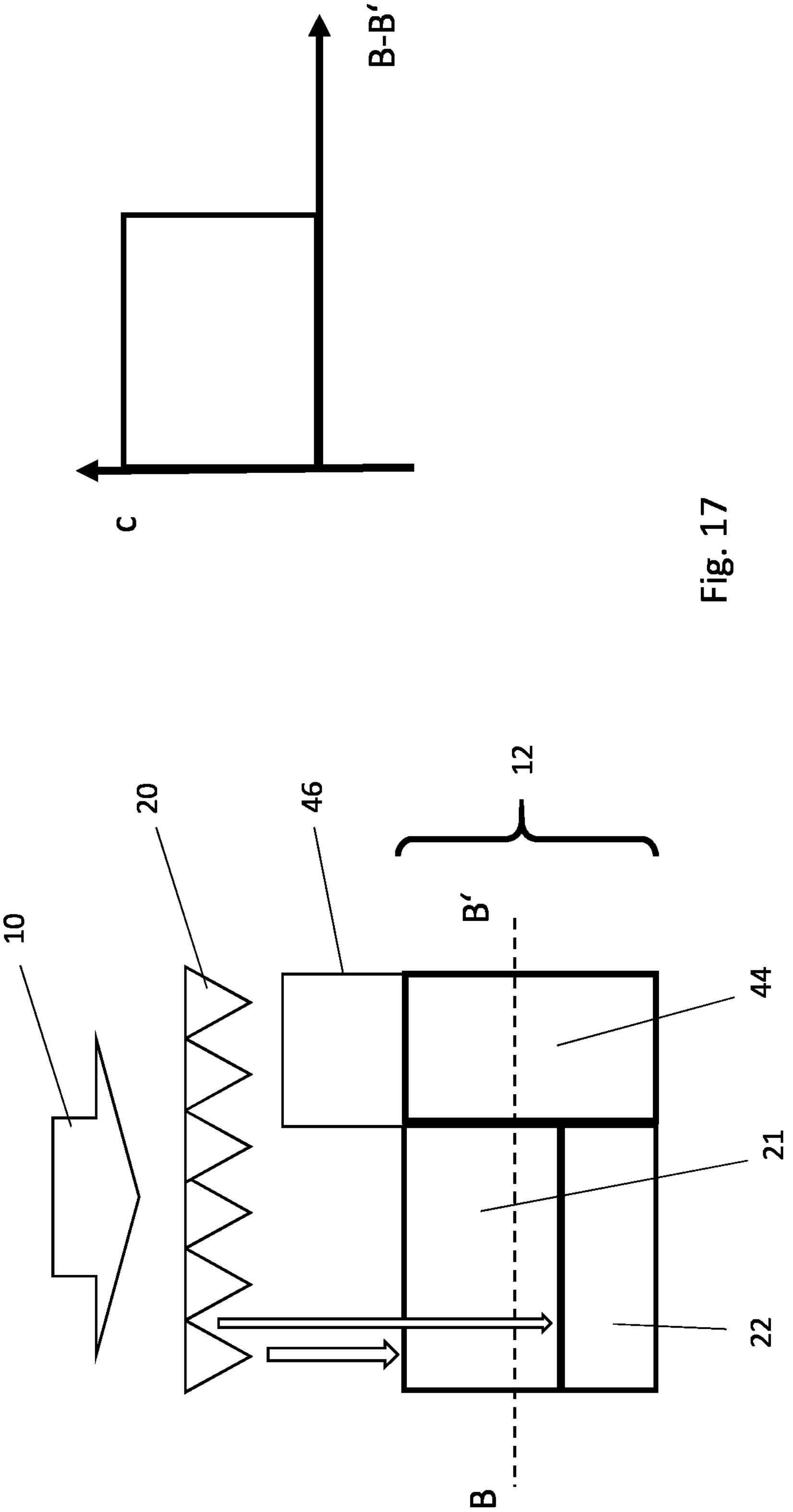
FIG. 17 shows a schematic of the doping profile of the first layer of the donor substrate using partial masking of the donor substrate, and a resultant alternative doping profile of the donor substrate.

As shown in FIG. 17, in the ion implantation by means of an energy filter 20 into the first layer 21 of the donor substrate 12 (and/or into the supplementary doped layer 38 of the composite substrate 18), a mask 46 may be used in order to create one or more undoped regions 44 in the first layer 21 of the donor substrate 12 (and/or in the supplementary doped layer 38 of the composite substrate 18).

The composite substrate 18 may also be characterized by further intermediate steps on the route to the finished semiconductor component, for example by the implanting of further active areas, the creating of oxides, the depositing of gate electrodes, contacts, wires or vias etc.

In the context of this description, "bonded" is understood to mean bonded directly or indirectly, i.e. with intermediate inclusion of a further element. A "bond" between two elements may also be direct or indirect.

The invention claimed is:

1. A method for producing a pretreated composite substrate which serves as a basis for further processing into electronic semiconductor components, the method comprising the steps of:

a) providing a donor substrate comprising monocrystalline SiC, wherein the donor substrate has a first layer extending from a first surface of the donor substrate to a predetermined doping depth, followed by a remaining portion of the donor substrate;

b) doping the first layer in the donor substrate in its entirety by ion implantation using an ion beam of ions of N, P, or Al, which passes through an energy filter, wherein the energy filter is a microstructured membrane having a predefined structure profile for adapting a dopant depth profile and/or defect depth profile caused by the implantation in the first layer in the donor substrate, wherein the doping creates a predetermined dopant depth profile and/or a predetermined defect depth profile in the first layer of the donor substrate, wherein the doping of the first layer extends from the first surface of the donor substrate, which faces the ion beam, up to the predetermined doping depth, wherein the doping of the first layer with the ions of N, P or Al affords p-doping or n-doping with a doping concentration in the first layer of 1E15 $cm^{-3}$ to 5E17 $cm^{-3}$;

c) creating an intended breakage site in the donor substrate by additional ion implantation that is different from the step of doping the first layer, electron irradiation, or laser irradiation;

d) providing the acceptor substrate and producing a bond between the donor substrate and the acceptor substrate, wherein the first layer is arranged in a region between the acceptor substrate and the remaining portion of the donor substrate;

e) splitting the donor substrate in the region of the intended breakage site to create the pretreated composite substrate, wherein the pretreated composite substrate comprises the acceptor substrate and a doped layer bonded thereto, wherein the doped layer comprises at least a section of the first layer of the donor substrate.

2. The method of claim 1, wherein the first layer has a thickness of 3 to 15 μm.

3. The method of claim 1, wherein the donor substrate is a crystal composed of high-quality semi-insulating SiC material of high purity.

4. The method of claim 3, wherein the donor substrate is composed of SiC of the 4H, 6H or 3C polytype.

5. The method of claim 3, wherein the surface of the donor substrate facing the ion beam has a deviation of less than 6° from a perpendicular to the c direction.

6. The method of claim 3, wherein the donor substrate has a thickness of more than 100 μm up to 15 cm.

7. The method of claim 1, wherein the donor substrate has a carrier wafer and an epitaxial layer, wherein the epitaxial layer is undoped or has a doping of less than 1E15 $cm^{-3}$ and wherein the first layer is part of the epitaxial layer.

8. The method of claim 7, wherein the epitaxial layer has a thickness of more than 10 μm.

9. The method of claim 7, wherein the surface of the epitaxial layer facing the ion beam has a deviation of less than 6° from a perpendicular to the c direction.

10. The method of claim 7, wherein the epitaxial layer is composed of SiC of the 4H, 6H or 3C polytype.

11. The method of claim 1, wherein the doping of the first layer affords a substantially constant dopant depth profile and/or defect depth profile.

12. The method of claim 1, wherein the doping of the first layer affords a dopant depth profile and/or defect depth profile which declines in steps, wherein the steps are formed in a near-surface region of the first layer, which faces the ion beam, by up to 40% of the total depth of the first layer.

13. The method of claim 12, wherein a difference in concentration between the highest and lowest steps is at least a factor of 10.

14. The method of claim 12, wherein the depthwise extent of the flank regions of the steps is predominant over the depthwise extent of the stepped plateaus.

15. The method of claim 1, wherein the doping of the first layer affords a continuously declining dopant depth profile and/or defect depth profile.

16. The method of claim 15, wherein the continuously declining dopant depth profile and/or defect depth profile is a profile according to the following formula:

$$D(z)=D\_\mathrm{max}\cdot(1-1/\sqrt{\phantom{x}}(1+\propto\cdot(1-z/b))\cdot f)+D\_0$$

wherein $D_{max}$ is a maximum doping concentration,

α is a value between 10 and 10 000, z is a distance from the surface, b is a layer thickness, f is a tolerance factor between 0.95 and 1.05, and $D_0$ is a background doping.

17. The method of claim 1, further comprising the step of creating a contact layer in a surface region of the first layer, or of applying a contact layer to the surface of the first layer, and wherein the bonding between the donor substrate and acceptor substrate is established via the contact layer, resulting in the following sequence: acceptor substrate, contact layer, remaining portion of first layer or first layer, remaining portion of the donor substrate.

18. The method of claim 17, wherein the contact layer is created by ion implantation.

19. The method of claim 17, wherein a dopant concentration in the contact layer is at least 100 times greater than an average dopant concentration in the remainder of the first layer or in the first layer.

20. The method of claim 17, wherein a dopant concentration in the contact layer is more than 1E17 $cm^{-3}$.

21. The method of claim 19, wherein the intended breakage site is in an end region of the first layer close to the predetermined doping depth, wherein the end region is not thicker than 1 μm.

22. The method of claim 1, wherein the intended breakage site is in the region of the remaining portion of the donor substrate, and wherein, in addition, after step e), the further step of performing ion implantation using an energy filter into the composite substrate is performed in a supplementary layer from the side remote from the acceptor substrate.

23. The method of claim 22, wherein the ion implantation into the supplementary layer of the composite substrate extends at least up to the doped layer.

24. The method of claim 23, wherein the ion implantation into the composite substrate is performed in such a way that the combination of the two dopant depth profiles and/or defect depth profiles of the first layer and of the supplementary layer is a constant profile, a profile that rises stepwise toward the acceptor substrate, or a profile that rises continuously toward the acceptor substrate.

25. The method of claim 1, wherein the intended breakage site is created by ion implantation of split-triggering ions.

26. The method of claim 25, wherein the split-triggering ions are introduced over the entire width of the donor substrate.

27. The method of claim 25, wherein the split-triggering ions are introduced only over a portion of the width of the donor substrate.

28. The method of claim 27, wherein the split-triggering ions are introduced only in at least one edge region of the donor substrate.

29. The method of claim 25, wherein the split-triggering ions are selected from the following: H, H2, He, B.

30. The method of claim 29, wherein the split-triggering ions are high-energy ions having an energy between 0.5 and 10 MeV.

31. The method of claim 25, wherein a particle dose of the split-triggering ions is in each case between 1E15 $cm^{-2}$ and 5E17 $cm^{-2}$.

32. The method of claim 25, wherein the energy spread of the ion beam of the split-triggering ions is less than $10^{-2}$.

33. The method of claim 1, wherein the splitting of the donor substrate is triggered by a thermal treatment of the composite substrate at a temperature of between 600° C. and 1300° C.

34. The method of claim 1, wherein the bonding is established by a thermal treatment of the composite substrate at a temperature of between 800° C. and 1600° C.

35. The method of claim 1, wherein both the establishment of the bonding and the splitting of the donor substrate are effected by a thermal treatment, with both steps being conducted simultaneously.

36. The method of claim 1, wherein the step of establishing the bonding is preceded by a wet-chemical pretreatment, plasma pretreatment or ion beam pretreatment of at least one of the surfaces to be bonded.

37. The method of claim 1, wherein the acceptor substrate is thermally stable up to at least 1500° C. and has a coefficient of linear expansion that deviates by not more than 20% from the coefficient of linear expansion of SiC.

38. The method of claim 37, wherein the acceptor substrate is formed from polycrystalline SiC or graphite.

39. The method of claim 1, wherein the step of splitting is followed by an aftertreatment of the surface of the composite substrate in the region of the intended breakage site by polishing and/or removal of defects.

40. The method of claim 1, wherein implantation defects in the pretreated composite substrate are annealed at temperatures between 1500° C. and 1750° C.

* * * * *